United States Patent
Ryu et al.

(10) Patent No.: US 7,820,514 B2
(45) Date of Patent: Oct. 26, 2010

(54) METHODS OF FORMING FLASH MEMORY DEVICES INCLUDING BLOCKING OXIDE FILMS

(75) Inventors: Min-kyung Ryu, Seoul (KR); Han-mei Choi, Seoul (KR); Seung-hwan Lee, Gyeonggi-do (KR); Sun-jung Kim, Gyeonggi-do (KR); Se-hoon Oh, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 604 days.

(21) Appl. No.: 11/756,427

(22) Filed: May 31, 2007

(65) Prior Publication Data
US 2008/0076224 A1    Mar. 27, 2008

(30) Foreign Application Priority Data
Sep. 27, 2006    (KR) .................... 10-2006-0094332

(51) Int. Cl.
*H01L 21/336* (2006.01)

(52) U.S. Cl. ................ 438/288; 438/591; 257/E21.423

(58) Field of Classification Search ................. 438/288, 438/591
See application file for complete search history.

(56) References Cited

U.S. PATENT DOCUMENTS

| 6,548,422 B1 * | 4/2003 | Roy et al. .................... 438/775 |
| 2004/0264236 A1 * | 12/2004 | Chae et al. .................... 365/154 |

FOREIGN PATENT DOCUMENTS

| JP | 11-040682 | 2/1999 |
| JP | 2006-237311 | 9/2006 |
| KR | 10-2000-0001261 | 1/2000 |

* cited by examiner

*Primary Examiner*—Jack Chen
(74) *Attorney, Agent, or Firm*—Myers Bigel Sibley & Sajovec, P.A.

(57) ABSTRACT

A method of forming a flash memory device can include forming a tunneling oxide film on a semiconductor substrate, forming a charge storing layer on the tunneling oxide film, forming a first blocking oxide film on the charge storing layer at a first temperature, forming a second blocking oxide film on the first blocking oxide film at a second temperature higher than the first temperature, and forming a gate electrode on the second blocking oxide film.

11 Claims, 3 Drawing Sheets

METHODS OF FORMING FLASH MEMORY DEVICES INCLUDING BLOCKING OXIDE FILMS

CROSS-REFERENCE TO RELATED PATENT APPLICATION

This application claims the benefit of Korean Patent Application No. 10-2006-0094332, filed on Sep. 27, 2006, in the Korean Intellectual Property Office, the disclosure of which is incorporated by reference herein in its entirety.

FIELD OF THE INVENTION

The present invention relates to the field of electronics, and more particularly, to methods of forming nonvolatile memories.

BACKGROUND

Charge-trapping type flash memory devices are being widely applied in various fields such as mobile telecommunication systems and memory cards. One type of charge-trapping type flash memory device includes a stacked gate structure obtained by sequentially stacking a tunneling oxide film, a charge storing layer, a blocking oxide film and a gate electrode on a semiconductor substrate. The tunneling oxide film can contact source/drains composed of impurity regions formed in the semiconductor substrate. Also, the charge storing layer can include a trap site which stores charges passing through the tunneling oxide film. The blocking oxide film can prevent/reduce leakage of the electrons to the gate electrode when they are trapped at the trap site in the charge storing layer and may prevent/reduces intrusion of the charges of the gate electrode into the charge storing layer when they are trapped at the trap site in the charge storing layer.

In the charge-trapping type flash memory device constructed as above, the electrons having passed through the tunneling oxide film by a voltage supply can be trapped at the trap site in the charge storing layer. In the charge-trapping type nonvolatile semiconductor memory device, the threshold voltage Vth may vary based on whether the electrons are trapped in the charge storing layer or not.

SUMMARY

Embodiments according to the invention can provide methods of forming flash memory devices including blocking oxide films. Pursuant to these embodiments, a method of forming a flash memory device can include forming a tunneling oxide film on a semiconductor substrate, forming a charge storing layer on the tunneling oxide film, forming a first blocking oxide film on the charge storing layer at a first temperature, forming a second blocking oxide film on the first blocking oxide film at a second temperature higher than the first temperature, and forming a gate electrode on the second blocking oxide film.

In some embodiments according to the invention, a method of forming a flash memory device can include forming a first blocking oxide film directly on a charge storing layer at a first temperature using a first deposition step so that the first blocking oxide film has a dielectric constant greater than SiOxNy formed to an equal thickness and forming a second blocking oxide film on the first blocking oxide film at a second temperature higher than the first temperature so that a combined impurity content of the first and second blocking oxide films is less than a layer formed at the first temperature to a combined thickness of the first and second blocking oxide films.

In some embodiments according to the invention, a method of forming a flash memory device can include forming a first blocking oxide film directly on a charge storing layer at a first temperature of about 250° C. to a first thickness comprising from about 5% to about less than 50% of a total thickness of a combined blocking oxide film and forming a second blocking oxide film directly on the first blocking oxide film at a second temperature of about 600° C. to provide the combined blocking oxide film.

BRIEF DESCRIPTION OF THE DRAWINGS

The above and other features and advantages of the present invention will become more apparent by describing in detail exemplary embodiments thereof with reference to the attached drawings in which.

DESCRIPTION OF EMBODIMENTS ACCORDING TO THE INVENTION

Figure 1:
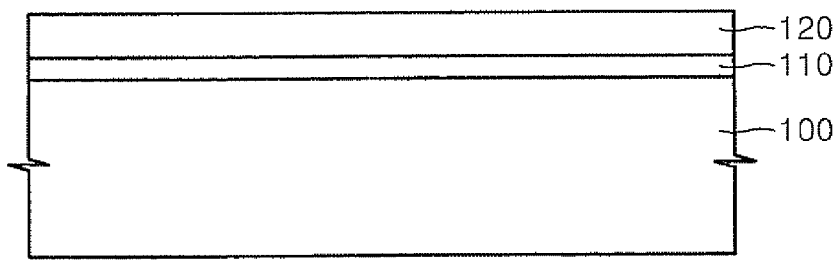
FIGS. 1 through 5 are cross-sectional views illustrating methods of manufacturing flash memory devices in some embodiments according to the present invention.

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As appreciated by the present inventors, typically, when a blocking oxide film is formed on a charge storing layer, interfacial surface characteristics between the charge storing layer and the blocking oxide film may be relatively good if the blocking oxide film is formed at a relatively low deposition temperature. However, impurities, such as carbon C or hydrogen H, may be introduced into the blocking oxide film when formed at the low deposition temperature, which may cause an increase in leakage current. As further appreciated by the present inventors, alternatively, if the blocking oxide film is formed at a relatively high deposition temperature, an interfacial layer having a relatively low dielectric constant, such as SiOxNy, may be formed between the charge storing layer and the blocking oxide film, unstable interfacial characteristics may be generated which may adversely affect programming and erasing voltages. As described herein below in greater detail, the present inventors appreciate that a two-step deposition process may be used to address the problems outlined above.

FIGS. 1 through 5 are sectional views illustrating methods of manufacturing flash memory devices in some embodiments according to the present invention. Referring to FIG. 1, a tunneling oxide film 110 is formed on a semiconductor substrate 100, such as a silicon substrate. The tunneling oxide film 110 may include silicon and oxygen, such as a silicon oxide film, formed to a thickness of about 20~70 Angstroms.

A charge storing layer 120 is formed on the tunneling oxide film 110. The charge storing layer 120 may include silicon and nitrogen, such as a silicon nitride film or a high dielectric constant (high-k) film having a dielectric constant greater than that of the silicon nitride film. For example, the charge storing layer 120 may be composed of $Si_3N_4$, metal oxide, metal nitride or a combination of these materials. The charge storing layer 120 may have a thickness of about 40~120 Angstroms.

Figure 2:
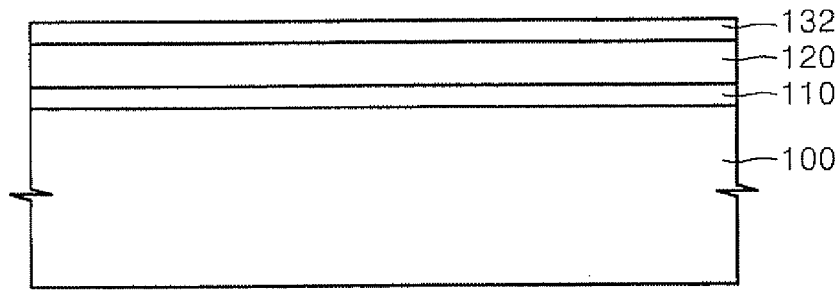

Referring to FIG. 2, in order to form a blocking oxide film on the charge storing layer 120, a first blocking oxide film 132 is formed at a first temperature which is a relatively low temperature condition. The first temperature for forming the first blocking oxide film 132 may be from about room temperature to about 600° C. In some embodiments according to the invention, "room temperature" can be about 25° C. The first blocking oxide film 132 may be formed by physical vapor deposition (PVD), atomic layer deposition (ALD) or chemical vapor deposition (CVD). The first blocking oxide film 132 may include a metal and oxygen, such as a $Al_2O_3$, $SiO_2$, $HfO_2$, $ZrO_2$, LaO, LaAlO, LaHfO and/or HfAlO.

A thickness of the first blocking oxide film 132 may be diverse according to a total thickness of the blocking oxide film intended to be finally formed. In some embodiments according to the invention, the thickness of the first blocking oxide film 132 may be about 5 to about 50% of the total thickness of the intended blocking oxide film. For example, if the total thickness of the intended blocking oxide film is 200 Angstroms, the first blocking oxide film 132 may have a thickness of about 10~100° Angstroms.

Figure 3:
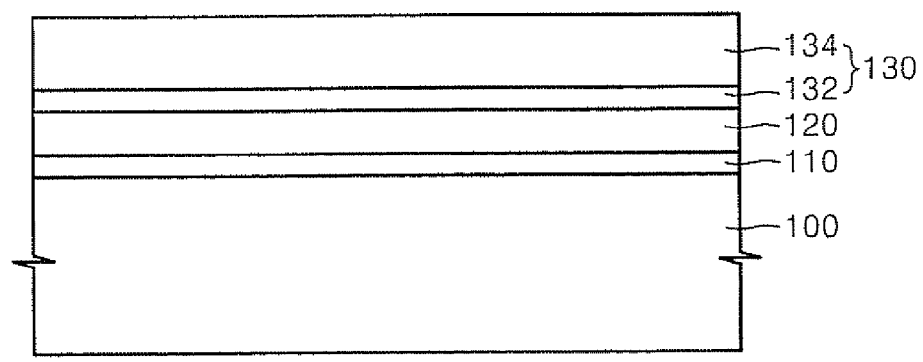

Referring to FIG. 3, in order to complete the blocking oxide film, a second blocking oxide film 134 is formed on the first blocking oxide film 132 at a second temperature which is relatively higher than the first temperature. The second temperature for forming the second blocking oxide film 134 may be about 250 to about 950° C. The second blocking oxide film 134 may be formed by PVD, ALD or CVD, for example. The second blocking oxide film 134 may include a metal and oxygen, such as $Al_2O_3$, $SiO_2$, HfO, $ZrO_2$, LaO, LaAlO, LaHfO and/or HfAlO. A blocking oxide film 130 including the first blocking oxide film 132 and the second blocking oxide film 134 may be formed to a total thickness of about 150~250 Angstroms.

The blocking oxide film 130 composed of the first blocking oxide film 132 and the second blocking oxide film 134 can reduce the migration of electrons (having passed through the tunneling oxide film 110) from the charge storing layer 120 to a gate electrode disposed above.

Figure 4:
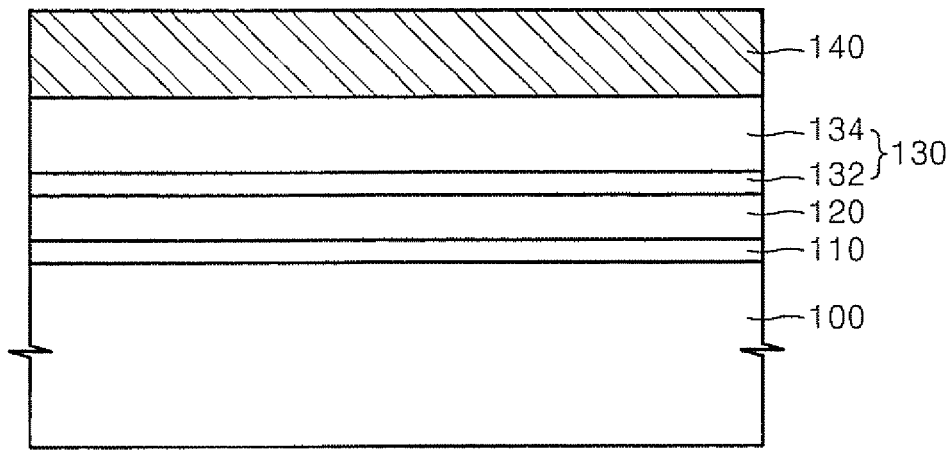

Referring to FIG. 4, a conductive material is deposited on the blocking oxide film 130 to form a gate electrode 140. The gate electrode 140 may include a metal and nitrogen (and a silicide), such as TaN, TiN, W, WN, HfN and tungsten silicide.

Figure 5:
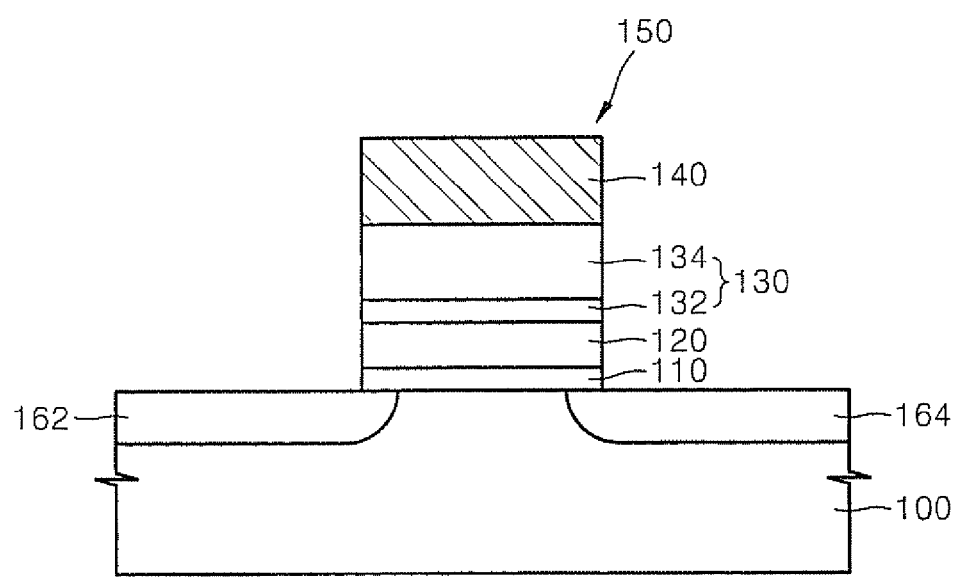

Referring to FIG. 5, the gate electrode 140, the blocking oxide film 130, the charge storing layer 120 and the tunneling oxide film 110 are sequentially patterned, thereby forming a stacked gate structure 150. Then, an impurity is implanted into the surface of the semiconductor substrate 100 exposed on both sides of the stacked gate structure 150 to form doped regions, which can be thermally treated to form source/drain regions 162 and 164.

Figure 6:
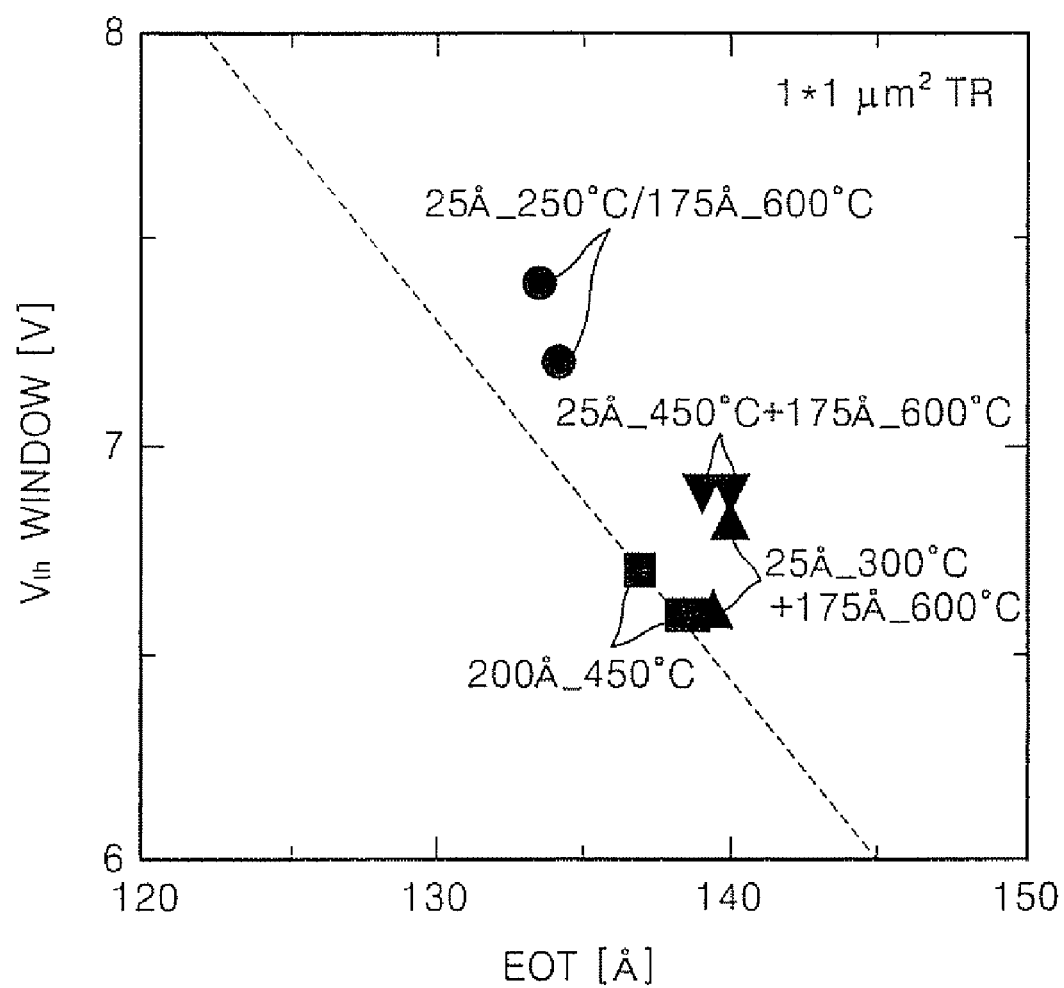
FIG. 6 is a graph illustrating voltage differences between flash memory devices having a blocking oxide film formed at various temperatures in some embodiments according to the present invention.

FIG. 6 is a graph plotting a result of evaluating a difference between a threshold voltage Vth of programming and a threshold voltage Vth of erasing, i.e., a threshold voltage Vth window, in a flash memory device having a blocking oxide film formed at various temperatures according to the method of manufacturing the flash memory of the present invention.

In order to evaluate the threshold voltage Vth window, a tunneling oxide film composed of silicon oxide to a thickness of 40 Angstroms, a charge storing layer composed of silicon nitride to a thickness of 70 Angstroms, and a blocking oxide film composed of $Al_2O_3$ to a thickness of 200 Angstroms were formed on a silicon substrate. Then, a gate electrode composed of TaN was formed to a thickness of 200 Angstroms on the resultant structure. The gate electrode had a dimension of 1 micron in both length and width.

In FIG. 6, a shape ● displayed a state that the blocking oxide film of $Al_2O_3$ was formed by two-step processing of forming a first $Al_2O_3$ film to a thickness of 25 Angstroms at a temperature of 250° C. and then a second $Al_2O_3$ film to a thickness of 175 Angstroms at a temperature of 600° C. according to the method of the present invention. A shape ▲ displayed a state that the blocking oxide film of $Al_2O_3$ was formed by two-step processing of forming a first $Al_2O_3$ film to a thickness of 25 Angstroms at a temperature of 300° C. and then a second $Al_2O_3$ film to a thickness of 175 Angstroms at a temperature of 600° C. according to the method of the present invention. A shape ▼ displayed a state that the blocking oxide film of $Al_2O_3$ was formed by two-step processing of forming a first $Al_2O_3$ film to a thickness of 25 Angstroms at a temperature of 450° C. and then a second $Al_2O_3$ film to a thickness of 175 Angstroms at a temperature of 600° C. according to the method of the present invention.

A comparative example denoted by a shape ■ is also displayed in FIG. 6. Here, the comparative example ■ displayed a case that the $Al_2O_3$ blocking oxide film was formed to a thickness of 200° C. at a temperature of 450° C. by single step processing.

In view of all cases evaluated as in FIG. 6, each $Al_2O_3$ film was formed by ALD. After completing memory devices by a general method while identically setting other conditions with respect to all cases displayed in FIG. 6 besides the forming of the blocking oxide film described as above, threshold voltages Vth when programming and erasing the memory devices were evaluated. A dotted line in FIG. 6 denotes a decrease tendency of the threshold window as an effective oxide film thickness EOT can be increased in a general flash memory device.

Referring to FIG. 6, the threshold voltage window is greater at the same level of the EOT when the memory device is manufactured by the method according to the present invention as compared with the comparative example.

That is, in the flash memory device manufactured by the method according to the present invention, the blocking oxide film is formed by two separate depositions: a first deposition at a relatively low temperature and a second deposition at a relatively high temperature. Therefore, formation of an oxide film with a low dielectric constant on an interfacial surface between the charge storing layer and the blocking oxide film can be reduced, and an impurity within the blocking oxide film may be decreased to reduce leakage current.

According to the present invention, a blocking oxide film included in a flash memory device is formed by two-step processing of first deposition at a relatively low temperature and second deposition at a relatively high temperature. Thus, a first blocking oxide film is deposited at a low temperature adjacent to the charge storing layer to reduce the likelihood of the formation of a low dielectric constant layer at an interface with the charge storing layer. Furthermore, a second blocking oxide film is formed on the first blocking oxide film at a temperature relatively higher than that applied when forming of the first blocking oxide film, so that an impurity content within the blocking oxide film can be reduced to help avoid generation of a leakage current. According to the present invention, a threshold voltage may be increased compared with forming the blocking oxide film by the conventional single processing, so that operational characteristics of the flash memory device can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A method of manufacturing a flash memory device comprising:
    forming a tunneling oxide film on a semiconductor substrate;
    forming a charge storing layer on the tunneling oxide film;
    forming a first blocking oxide film on the charge storing layer at a first temperature, the first blocking oxide film having a first surface facing the semiconductor substrate and a second surface opposite to the first surface;
    forming a second blocking oxide film on the second surface of the first blocking oxide film at a second temperature higher than the first temperature; and
    forming a gate electrode on the second blocking oxide film.

2. The method of claim 1, wherein the first temperature is about room temperature to about 600° C.

3. The method of claim 1, wherein the second temperature is about 250 to about 950° C.

4. The method of claim 1, wherein the first blocking oxide film is formed to a thickness of about 5 to about 50% of a combined thickness of the first blocking oxide film and the second blocking oxide film.

5. The method of claim 1, wherein a combined thickness of the first blocking oxide film and the second blocking oxide film is about 150 to about 250 Angstroms.

6. The method of claim 1, wherein the first blocking oxide film and the second blocking oxide film each comprise a metal and oxygen.

7. The method of claim 6 wherein the first blocking oxide film and the second blocking oxide film each comprise $Al_2O_3$, $SiO_2$, $HfO_2$, $ZrO_2$, LaO, LaAlO, LaHfO and/or HfAlO.

8. The method of claim 1, wherein the first blocking oxide film and the second blocking oxide film are each formed by physical vapor deposition (PVD), atomic layer deposition (ALD) or chemical vapor deposition (CVD).

9. The method of claim 1, wherein the tunneling oxide film comprises a film including silicon and oxygen.

10. The method of claim 1, wherein the charge storing layer comprises a silicon nitride film, a metal oxide film, a metal nitride film or a combination thereof 11. The method of claim 1, wherein the gate electrode comprises a material of TaN, TiN, W, WN, HfN and/or tungsten silicide.

* * * * *